United States Patent
Zilkie

(10) Patent No.: US 9,997,890 B2
(45) Date of Patent: Jun. 12, 2018

(54) DISCRETE WAVELENGTH TUNABLE LASER

(71) Applicant: ROCKLEY PHOTONICS LIMITED, London (GB)

(72) Inventor: Aaron John Zilkie, Pasadena, CA (US)

(73) Assignee: Rockley Photonics Limited, London (GB)

(*) Notice: Subject to any disclaimer, the term of this patent is extended or adjusted under 35 U.S.C. 154(b) by 0 days. days.

(21) Appl. No.: 15/488,400

(22) Filed: Apr. 14, 2017

(65) Prior Publication Data

US 2017/0222398 A1    Aug. 3, 2017

Related U.S. Application Data

(63) Continuation-in-part of application No. 14/925,924, filed on Oct. 28, 2015, now Pat. No. 9,627,851.

(51) Int. Cl.
*H01S 5/0625* (2006.01)
*H01S 5/125* (2006.01)
(Continued)

(52) U.S. Cl.
CPC ........... *H01S 5/06256* (2013.01); *G02F 1/00* (2013.01); *H01S 3/1055* (2013.01); *H01S 5/125* (2013.01);
(Continued)

(58) Field of Classification Search
CPC ....... H01S 5/06256; H01S 5/125; H01S 5/042
See application file for complete search history.

(56) References Cited

U.S. PATENT DOCUMENTS

| 4,896,325 A | 1/1990 | Coldren |
| 5,838,714 A | 11/1998 | Delorme |

(Continued)

FOREIGN PATENT DOCUMENTS

| EP | 0 665 617 A1 | 1/1995 |
| GB | 2 371 920 A | 8/2002 |

(Continued)

OTHER PUBLICATIONS

Busico, G. et al., "A widely tunable Digital Supermode DBR laser with high SMSR", ECOC 2002, 28th European Conference on Optical Communication, Sep. 8-12, 2002, p. 3.3.2, vol. CONF. 28, Copenhagen, Denmark.

Ciaffoni, L., et al. "Demonstration of a widely tunable digital supermode distributed Bragg reflector laser as a versatile source for near-infrared spectroscopy", Applied Physics B, 2013, 7 pages.

(Continued)

*Primary Examiner* — Dung Nguyen
(74) *Attorney, Agent, or Firm* — Lewis Roca Rothgerber Christie LLP

(57) ABSTRACT

A multisection digital supermode-distributed Bragg reflector (MSDS-DBR) comprising: a plurality P of digital supermode Bragg reflector (DS-DBR) grating sections arranged along a waveguide; wherein each DS-DBR grating section is configured to pass or reflect light over a given spectral region, the given spectral region being different from the spectral regions of the other DS-DBR grating sections; wherein each DS-DBR grating section comprises a plurality M of grating sub-regions, each sub-region corresponding to a spectral sub-band within the spectral region of the DS-DBR grating section, and wherein each grating sub-region includes a positive electrical contact and a negative electrical contact; said grating sub-region being configured to pass or reflect light of its spectral sub-band when an electrical bias is provided between its positive and negative electrical contacts.

20 Claims, 9 Drawing Sheets

(51) Int. Cl.
- *G02F 1/00* (2006.01)
- *H01S 3/1055* (2006.01)
- *H01S 5/14* (2006.01)
- *H01S 3/106* (2006.01)
- *H01S 5/028* (2006.01)

(52) U.S. Cl.
CPC .............. *H01S 5/141* (2013.01); *H01S 3/106* (2013.01); *H01S 5/0287* (2013.01); *H01S 5/142* (2013.01)

(56) References Cited

U.S. PATENT DOCUMENTS

| | | | |
|---|---|---|---|
| 7,106,765 B2 | 9/2006 | Carter et al. | |
| 7,145,923 B2 | 12/2006 | Carter et al. | |
| 9,240,673 B2 | 1/2016 | Rickman et al. | |
| 2009/0161717 A1* | 6/2009 | Reid | H01S 5/06256 372/50.11 |
| 2010/0296539 A1 | 11/2010 | Fukuda et al. | |
| 2011/0292955 A1 | 12/2011 | Kaneko | |
| 2015/0010033 A1* | 1/2015 | Davies | H01S 5/06256 372/50.11 |
| 2015/0010264 A1 | 1/2015 | Kaneko | |

FOREIGN PATENT DOCUMENTS

| | | |
|---|---|---|
| GB | 2 373 632 A | 9/2002 |
| WO | WO 03/012936 A2 | 2/2003 |

OTHER PUBLICATIONS

Coldren et al., "Improved Sampled Grating DBR Widely-Tunable 1.55 μm Lasers," Naval Research Laboratory, Contract No. NOOO14-96-1-G014, 248 pages, Mar. 6, 2000.

European Search Report issued in Application GB 1522542.8, dated Feb. 11, 2016, 5 pages.

International Search Report and Written Opinion of the International Searching Authority, dated Feb. 7, 2017, Corresponding to PCT/GB2016/053350, 14 pages.

Keyvaninia et al., "III-V-on-silicon multi-frequency lasers," Optics Express, 21(11):13675-13683, May 30, 2013.

Overton, "Tunable Lasers: Optimized SOA ups power in DBR tunable laser," http://www.laserfocusworld.com/articles/print/volume-43/issue-12/world-news/tunable-lasers-optimized-soa-ups-power-in-dbr-tunable-laser.html, Dec. 1, 2007, 8 pages.

Reid, DCJ et al., A novel broadband DBR laser for DWDM networks with simplified quasi-digital wavelength selection, Optical Fiber Communication Conference, Mar. 21, 2002, pp. 541-543, Optical Society of America. (https://www.osapublishing.org/abstract.cfm?uri=ofc-2002-ThV5&origin=search).

Ward et al., "Modelling of phase-grating based wideband tuneable lasers with simplified quasi-digital wavelength selection," IEE Proc.-Optoelectron., 150(2):199-204, Apr. 2003.

Ward et al., "Widely Tunable DS-DBR Laser With Monolithically Integrated SOA: Design and Performance," IEE Journal of Selected Topics in Quantum Electronics, 11(1):149-156; Jan./Feb. 2005.

Whitbread et al., "Digital wavelength selected DBR laser," Proceedings of SPIE, 4995:81-93, 2003.

\* cited by examiner

DISCRETE WAVELENGTH TUNABLE LASER

CROSS-REFERENCE TO RELATED APPLICATION(S)

The present application is a continuation-in-part of U.S. patent application Ser. No. 14/925,924, filed Oct. 28, 2015, entitled "DISCRETE WAVELENGTH TUNABLE LASER", the entire content of which is incorporated herein by reference.

The present application is related to U.S. Pat. No. 9,240,673, filed on Jan. 20, 2015, entitled "TUNABLE SOI LASER", ("the '673 patent"), the entire content of which is incorporated herein by reference.

FIELD

The present invention relates to distributed Bragg reflectors (DBRs), and particularly to multisection digital supermode-distributed Bragg reflectors (MSDS-DBRs) and discrete wavelength tunable lasers including MSDS-DBRs.

BACKGROUND

Continuously tunable lasers are well-established and are commonplace in telecommunications applications. Although telecommunications lasers operate to fixed grids (e.g., ITU grids), tunable lasers may be set up for a variety of applications and wavelength tunability is desirable to allow for correction of wavelength drift as the laser ages. Unfortunately, the requirement for full range and continuous tunability results in expensive and power-hungry electronic circuitry, most particularly due to the requirement for digital-to-analog conversion (DAC) chips.

Distributed feedback (DFB) lasers in which the gratings are built into the gain medium are being replaced by distributed Bragg reflector (DBR) lasers, particularly where tunability is required. For a wide range of tunability a sampled grating (SG) DBR laser is typically used, in which multiple waveguide gratings are cascaded with periodic blank regions, and these gratings are known as comb gratings. Thus are created reflectivity peaks which can be tuned to the required lasing wavelength.

In an alternative design of a tunable laser, digital supermode DBRs (DS-DBRs) may be utilised. The DS-DBR design has the advantage over an SG-DBR in that no DACs are required. However, related art tunable lasers made entirely on semiconductor chips may include gratings with DACs for control. Thus, there is a need for tunable lasers based upon the DS-DBR design principle but with cheaper and lower power consuming control electronics, in particular not requiring DACs.

Gratings can be tuned thermally, for example by incorporating electrodes to heaters on chip. However, for speed of operation, tuning by current injection can be used, for example by biasing a p-i-n or p-n diode junction.

The gratings of tunable lasers in related art III-V semiconductor material systems may have vertical p-i-n diode junctions with a common ground or negative electrode. In these lasers multiple grating sub-regions, such as those in a DS-DBR, require separate drive contacts but must share a common ground.

SUMMARY

Accordingly, the present invention aims to solve the above problems by providing, according to a first aspect, a multisection digital supermode-distributed Bragg reflector (MSDS-DBR) comprising: a plurality P of digital supermode Bragg reflector (DS-DBR) grating sections arranged along a waveguide; wherein each DS-DBR grating section is configured to pass or reflect light over a given spectral region, the given spectral region being different from the spectral regions of the other DS-DBR grating sections; wherein each DS-DBR grating section comprises a plurality M of grating sub-regions, each sub-region corresponding to a spectral sub-band within the spectral region of the DS-DBR, and wherein each grating sub-region includes a positive electrical contact and a negative electrical contact; said grating sub-region being configured to pass or reflect light of its spectral sub-band when an electrical bias is provided between its positive and negative electrical contacts. As used herein, a "plurality P" of elements means P elements, P being a positive integer.

In some embodiments of the present invention, each DS-DBR grating section will include an opto-electronic region such as a diode region. For example, where each DS-DBR sub-region includes a p-i-n diode junction, the electrical connections of the DS-DBR sub-regions provide a mechanism for applying electrical bias across the p-i-n junction to control the opto-electronic properties and therefore the transmittance or reflectance of each of the M spectral sub-bands.

The p-i-n diode junctions may be horizontal p-i-n junctions. The junctions are considered to be horizontal in that they are formed by a first doped region at (and/or extending into) one side wall of the waveguide and a second doped region at (and/or extending into) the opposite side wall of the waveguide. For example, an n-type region may be formed by implanting n-type dopant atoms into a side wall, and a p-type region may be formed by implanting p-type dopant atoms into a side wall (e.g., the opposite side wall). All or at least the majority of the doped regions of the semiconductor junction therefore lie along a horizontal plane.

The horizontal junction enables increased flexibility in both design and fabrication as the location of doped sections at either side of the waveguide rather than above or below the waveguide gives rise to a greater degree of freedom in terms of driving and connecting up multiple junction regions, complexity of driving scheme, ease of connections, size, and shape. With particular relevance to the present invention, horizontal p-i-n diode junctions may be provided in which both positive and negative electrodes can be discretized into multiple contacts to simplify driving circuits and even reduce number of gratings and allow for shorter laser cavities. This would not be possible for typical vertical p-i-n lasers which share a common ground as only the positive contacts of the vertical design lasers can be discretized into multiple sections.

Optionally, the multisection digital supermode-distributed Bragg reflector comprises a common electrode structure shared between two or more of the plurality of DS-DBR grating sections of the MSDS-DBRs; wherein the common electrode structure includes at least one common electrode(s), each of the at least one common electrode(s) connecting to an electrical contact on two or more of the DS-DBR grating sections to simultaneously provide an electrical bias to a respective one of the grating sub-regions on each of the two or more DS-DBR grating sections.

In this way, when a bias is applied via the common electrode, a bias will be applied simultaneously to a grating sub-region on each of the two or more DS-DBR grating sections. The common electrodes which contact the positive electrical contacts may be arranged such that they only connect to an electrical contact for one sub-region within each DS-DBR grating section. However, in such a system, a single common electrode may connect all of the negative electrical contacts as a common return.

In some embodiments, the common electrode structure includes a plurality M of common electrodes, each of the M common electrodes connecting to an electrical contact on each of the DS-DBR grating sections to simultaneously provide an electrical bias to a respective one of the M grating sub-regions of each of the DS-DBR grating sections.

In this way, when a bias is applied to a given one of the M common electrodes, the electrode will select a corresponding sub region within each of the plurality P of DS-DBR grating sections.

The common electrodes may be arranged to apply a bias to a particular grating sub-region in each DBR. For example, a first common electrode may be configured to apply a bias to the first grating sub-region in each of the P DS-DBR grating sections (i.e. the closest to the entrance to the waveguide). A second common electrode may be arranged to apply a bias to the second grating sub-region in each of the plurality P of DS-DBR grating sections (i.e. the second closest to the entrance of the waveguide). A third common electrode may be arranged to apply a bias to the third grating sub-region in each of the plurality P of DS-DBRs. This pattern may continue up until the $M^{th}$ common electrode which may be configured to apply a bias to the $M^{th}$ (i.e. the final) grating sub-region of each one of the plurality P of DS-DBRs.

Each grating sub-region will have a pair of electrical contacts consisting of two physical electrical contacts, a positive contact for connecting to a positive electrode (shared or otherwise) and a negative contact for connecting to a negative electrode (shared or otherwise).

The grating sections may be arranged to alternate in polarity. In this way, each grating sub-region faces in the opposite direction to its two closest neighbours.

Optionally, all of the M common electrodes are positive electrodes.

In some embodiments, regardless of the number of positive common electrodes, a single common negative electrode may connect to an electrical contact for each grating sub-region of all of the DS-DBRs. In this way, selection of the desired grating sub-region is achieved by way of a bias applied to the respective positive electrode.

In other embodiments, the multisection digital supermode-distributed Bragg reflector may comprise a plurality P of common negative electrodes, wherein each of the P common negative electrodes is configured to apply a negative bias to all of the grating sub-regions within a given one of the plurality P of DS-DBRs. In this way, coarse selection of the MSDS-DBR can be achieved by applying a negative bias to the common negative electrodes corresponding to the DS-DBR for which selection is desired; and fine selection of the MSDS-DBR can be achieved by applying a positive bias to the common positive electrode which provides an electrical contact to the desired grating sub-region.

Optionally, each of the DS-DBRs is a transmissive DS-DBR.

Alternatively, each of the DS-DBRs may be a reflective DS-DBR.

M and P are at least 2 and have maximum values limited by practical manufacturing and electrical contacting and driving constraints. Optionally, the number P of DS-DBRs in the MSDS-DBR is more than or equal to 4. The number M of grating sub-regions within each DS-DBR may also be more than or equal to 4. If P=4 and M=4, the MSDS-DBR will provide a mechanism for selecting one of 16 different spectral sub-bands (corresponding to 16 grating sub-regions). In an alternative embodiment P and/or M may be more than or equal to 7.

According to a second aspect of embodiments of the present invention, there is provided a discrete wavelength tunable laser comprising: a semiconductor optical amplifier (SOA) and a multisection digital supermode-distributed Bragg reflector (MSDS-DBR) according to the first aspect.

Where the MSDS-DBR includes a plurality of positive common electrodes and only a single negative electrode, the wavelength tunable laser will also comprise a coarse spectral filter having a plurality P of spectral passbands. In this way, the coarse spectral filter enables a selection of one of P different spectral passbands, each of which falls within the overall bandwidth of the SOA of the laser. The multisection digital supermode-distributed Bragg reflector (MSDS-DBR) then provides fine tuning to select a spectral sub-region within each of the P passbands. The spectral overlap of the spectral region chosen by the coarse selection and the spectral region chosen by the fine selection provides the lasing mode of the laser. The wavelength tunable laser provided by embodiments of the present invention advantageously does not therefore depend upon DACs for primary control.

Optionally, the coarse spectral filter may be a transmission DS-DBR (TDS-DBR), the TDS-DBR having a plurality P of transmission passbands, each of the P passbands corresponding to the given spectral region of a respective one of the DS-DBRs of the multisection digital supermode-distributed Bragg reflector (MSDS-DBR).

According to a third aspect of embodiments of the present invention, there is provided a discrete wavelength tunable laser comprising: an SOA; a coarse spectral filter for coarse tuning, the coarse spectral filter configured to pass P separate spectral passbands within the gain bandwidth of the SOA; and a multisection digital supermode-distributed Bragg reflector (MSDS-DBR) according to any one of the first aspect or second aspect of embodiments for fine tuning; wherein each of the P passbands of the coarse spectral filter corresponds to the given spectral region of one of the DS-DBRs of the multisection digital supermode-distributed Bragg reflector (MSDS-DBR).

Optionally, the coarse spectral filter is a transmission DS-DBR (TDS-DBR), the TDS-DBR having a plurality P of transmission passbands, each of the P passbands corresponding to the given spectral region of one of the DS-DBRs of the multisection digital supermode-distributed Bragg reflector (MSDS-DBR).

In this way, the TDS-DBR is configured to pass any one of P spectral passbands upon application of a bias current, all of which lie within the gain bandwidth of the SOA. Each DS-DBR grating section is configured to pass or reflect M sub-regions of the spectrum within a passband of the P passbands of the TDS-DBR.

The electrical contacts for one spectral sub region M in each of the P DS-DBR gratings in the MSDS-DBR grating may be connected with a common control electrode;

The SOA may be simply a semiconductor optical amplifier element (i.e., a semiconductor structure that, when driven by a suitable drive current, acts as a gain medium providing optical gain), or it may be a reflective semiconductor optical amplifier (RSOA), which may include (i) a semiconductor optical amplifier element having two facets, and (ii) a highly reflective broadband mirror forming a back mirror on one of the facets, which may then be referred to as the "back facet". The output of the laser cavity is located at the opposite end of the cavity from the RSOA. When the MSDS-DBR is transmissive, a (partially reflective) broadband mirror forms the output mirror of the laser cavity. When the MSDS-DBR is reflective, the MSDS-DBR itself forms the output mirror of the laser cavity.

According to a third aspect of embodiments of the present invention, there is provided a discrete wavelength tunable laser comprising: an SOA; a single reflective DS-DBR grating with N grating sub-regions, each sub-region corresponding to a spectral sub-band within the spectral region of the DS-DBR, wherein: each grating sub-region has a positive electrical contact and a negative electrical contact; and wherein: a single control circuit provides for an electrical bias to be applied across the positive and negative electrical contacts of each of the N grating sub-regions in order to control whether each of said grating sub-regions transmits or reflects light of their respective spectral sub-band.

By applying discrete predetermined currents to one or more of the contacts at the same time, it will result in reflectivity enhancement of a certain fixed sub-band. In one embodiment, the single DS-DBR has N=16 sections (i.e. 16 grating sub-regions). In one embodiment, the single DS-DBR has N=49 sections (i.e. 49 grating sub-regions).

For any of the reflective MSDS-DBRs disclosed herein, the reflectivity could be tailored to account for the non-uniformity of the spectral output of the SOA. For example, for parts of the gain bandwidth of the SOA where output power is low, the grating sub-regions corresponding to those wavelengths may exhibit an enhanced reflectivity relative to other grating sub-regions within the MSDS-DBR.

Similarly, for any transmissive MSDS-DBRs, the relative transmission values of grating sub-regions may be altered to compensate for wavelength dependent gain variation from the SOA.

Each of the one or more DS-DBRs may be a phase-tunable Distributed Bragg Reflector which preferably includes a phase tuning region, the carrier density of which can be manipulated by application of a current or voltage bias. The bias may be a forward bias or a reverse bias depending on the properties of the phase tuning region chosen. Adjusting the bias will in turn adjust the phase and position in frequency space of the reflectance spectrum or transmittance spectrum of that region of the DS-DBR. The phase tuning region may be a portion of or all of the DS-DBR.

Optionally, the phase tuning region includes a p-n junction device. In this way, the p-n junction device provides an electrically tunable phase tuning region whereby the phase of the reflectance spectrum of the DBR can be adjusted via carrier depletion by application of a varying reverse bias. The p-n junction may optionally be a p+-p-n-n+, or p++-p+-p-n-n+-n++ structure.

The MSDS-DBR may be reflective. If this is the case, no output mirror is needed.

Alternatively, the MSDS-DBR may be transmissive. If this is the case, an output mirror may be provided by way of an optical broadband mirror. Such a mirror could have reflectivity of 5-50% and typically more than 10%, or even more than 20%.

Optionally, for any one of the aspects above, the discrete wavelength tunable laser may further comprise one or more phase tuner(s) for fine tuning the wavelength of the laser.

This phase tuner would be separate from any phase tuners that may form part of the DS-DBR. The fine tuning phase tuner may be used to account for drift due to temperature or other environmental factors.

In a Si photonics waveguide the gratings are produced by, for example, etching teeth with a certain depth (usually 200-500 nm) in the top of the waveguide, along the whole width of the waveguide. For any one of the embodiments of the present invention, the silicon overlayer thickness of the waveguide platform comprising the laser and/or MSDS-DBR may be more than or equal to 1 µm and less than or equal to 4 µm. Even more preferably, the silicon overlayer thickness of the waveguide platform is more than or equal to 2.5 µm and less than or equal to 3.2 µm. Preferably, the ridge width of one or more waveguides of the waveguide platform is more than or equal to 1 µm and preferably less than or equal to 4 µm. Even more preferably, the ridge width of one or more waveguides of the waveguide platform is more than or equal to 2.5 µm and less than or equal to 3.2 µm.

Throughout the application, references to "light" should be understood to include electromagnetic radiation of infrared and ultraviolet wavelengths as well as the visible spectrum. The range in output wavelengths of the laser will depend on the semiconductor gain medium used which may fall within the range of 0.4-20 µm. Taking into account the silicon-on-insulator SOI platform, a wavelength range of a tunable SOI laser may be 1.1-1.7 µm.

According to an embodiment of the present invention there is provided a discrete wavelength tunable laser including: a reflective semiconductor optical amplifier having a back facet, an output facet, and a highly reflective broadband mirror on the back facet; and a DS-DBR grating coupled to the output facet, the DS-DBR grating including a plurality of grating sections arranged along a waveguide, each of the grating sections being configured to pass or reflect light over a given spectral region, the given spectral region being different from the spectral regions of the other DS-DBR grating sections, each of the grating sections including a positive electrical contact and a negative electrical contact, each of the grating sections being configured to pass or reflect light of its spectral region when an electrical bias is applied to its positive and negative electrical contacts.

In one embodiment, the tunable laser includes a broadband output mirror, the DS-DBR grating being between the reflective semiconductor optical amplifier and the broadband output mirror, wherein the tunable laser is configured to lase at a wavelength in a spectral region of a grating section, of the plurality of grating sections, configured, as a result of an electrical bias applied to its positive and negative electrical contacts, to pass light.

In one embodiment, the tunable laser is configured to lase at a wavelength in a spectral region of a grating section, of the plurality of grating sections, configured, as a result of an electrical bias applied to its positive and negative electrical contacts, to reflect light.

In one embodiment, the tunable laser includes a broadband output mirror, the DS-DBR grating being between the reflective semiconductor optical amplifier and the broadband output mirror.

In one embodiment, the DS-DBR grating includes 30 grating sections.

In one embodiment, the tunable laser includes a phase tuner between the reflective semiconductor optical amplifier and the DS-DBR grating.

According to an embodiment of the present invention there is provided a discrete wavelength tunable laser including: a reflective semiconductor optical amplifier having a back facet, an output facet, and a highly reflective broadband mirror on the back facet; a DS-DBR grating coupled to the output facet, the DS-DBR grating having a plurality of grating sections arranged along a waveguide; and a broadband output mirror, the DS-DBR grating being between the reflective semiconductor optical amplifier and the broadband output mirror, each of the grating sections being configured to pass or reflect light over a given spectral region, the given spectral region being different from the spectral regions of the other DS-DBR grating sections, each of the grating sections including a positive electrical contact and a negative electrical contact, each of the grating sections being configured to pass or reflect light of its spectral region when an electrical bias is applied to its positive and negative electrical contacts.

In one embodiment, the tunable laser is configured to lase at a wavelength in a spectral region of a grating section, of the plurality of grating sections, configured, as a result of an electrical bias applied to its positive and negative electrical contacts, to pass light.

In one embodiment, the tunable laser is configured to lase at a wavelength in a spectral region of a grating section, of the plurality of grating sections, configured, as a result of an electrical bias applied to its positive and negative electrical contacts, to reflect light.

In one embodiment, each of the grating sections includes a p-i-n diode junction, the positive and negative electrical contacts located at p and n doped regions of the p-i-n junction respectively for providing an electrical bias to the p-i-n junction for control of the transmittance or reflectance of each of the spectral regions.

In one embodiment, the p-i-n diode junctions are horizontal p-i-n junctions.

In one embodiment, the tunable laser includes n-type dopant atoms implanted into the first side wall, and a p-type region at the second side wall, including p-type dopant atoms implanted into the second side wall.

In one embodiment, the tunable laser includes the first side wall and the second side wall; the n-type region extends into the slab and includes an n++-doped layer in the slab; the p-type region extends into the slab and includes a p++-doped layer in the slab; the negative electrical contact is on the n++-doped layer; and the positive electrical contact is on the p++-doped layer.

In one embodiment, each of the grating sections includes a p-n diode junction, the positive and negative electrical contacts located at p and n doped regions of the p-n junction respectively for providing an electrical bias to the p-n junction for control of the transmittance or reflectance of each of the spectral regions.

In one embodiment, the p-n diode junctions are horizontal p-n junctions.

In one embodiment, the tunable laser includes n-type dopant atoms implanted into the first side wall, and a p-type region at the second side wall, including p-type dopant atoms implanted into the second side wall.

In one embodiment, the tunable laser includes the first side wall and the second side wall; the n-type region extends into the slab and includes an n++-doped layer in the slab; the p-type region extends into the slab and includes a p++-doped layer in the slab; the negative electrical contact is on the n++-doped layer; and the positive electrical contact is on the p++-doped layer.

In one embodiment, a first grating section of the grating sections is electrically isolated from a second grating section of the grating sections, the second grating section being adjacent, along the waveguide, to the first grating section.

In one embodiment, the DS-DBR grating is part of a silicon photonics chip.

In one embodiment, the DS-DBR grating includes 30 grating sections.

Further optional features of embodiments of the invention are set out below.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a discrete wavelength tunable laser provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
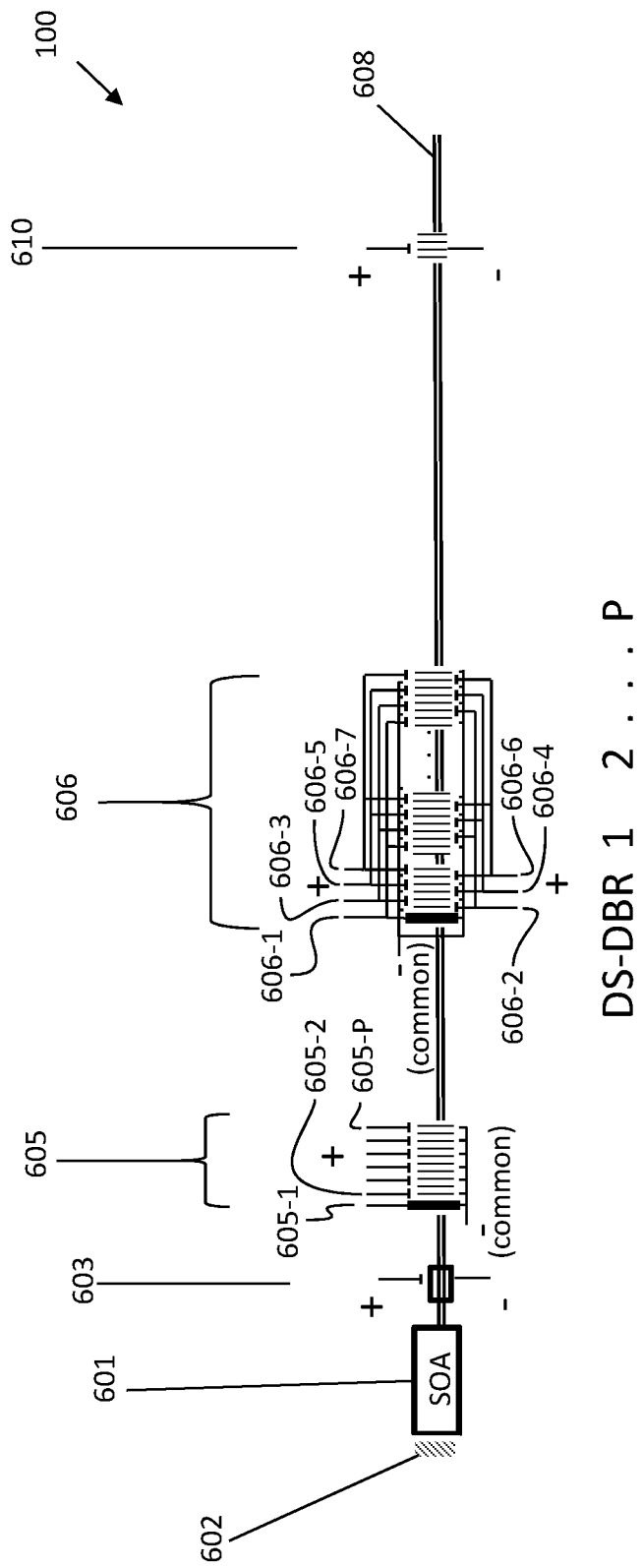
FIG. 1A shows a schematic diagram of a discrete wavelength tunable laser including a transmissive MSDS-DBR.

FIG. 1A depicts a discrete wavelength tunable laser 100 according to an embodiment of the present invention.

In this aspect the optical cavity is made up of (i) an RSOA including a semiconductor optical amplifier element 601 and, on the back facet of the semiconductor optical amplifier element 601 of the RSOA, a highly reflective broadband mirror 602; (ii) a transmissive digital supermode-distributed Bragg reflector (TDS-DBR) 605, having P sections and being configured to pass one of P corresponding spectral regions, or "coarse spectral regions" of width W within the gain bandwidth of the RSOA upon application of a bias current; and (iii) a multisection digital supermode-distributed Bragg reflector (MSDS-DBR) 606, the MSDS-DBR comprising: a plurality, P, of DS-DBR grating sections, or "DS-DBRs", each DS-DBR configured to pass (transmit) or reflect light over a given spectral region, the given spectral region being different from the spectral regions of the other DS-DBRs.

Each DS-DBR comprises a plurality M of grating sub-regions, and a plurality M of respective pairs of electrical contacts to each of the grating sub-regions. Each pair of electrical contacts may include a 'positive electrical contact' for connection to a positive electrode structure and a 'negative electrical contact' for connection to a negative electrode structure such that the DS-DBR is configured to pass or reflect any one of M different spectral sub-bands within its given spectral region upon electrical bias across the respective one of the M pairs of electrical contacts, or "electrodes". As used herein, a contact (or "electrical contact", or "electrode") is a piece of conducting material (e.g., metal) formed directly on a surface of a semiconductor device (e.g., a diode) for conducting current into or out of the device. An "electrode structure" is a conductive structure (e.g., wires, conductive traces, etc.) that joins one or more electrodes.

The MSDS-DBR grating may be a chirped Bragg reflector. When the MSDS-DBR is unbiased, each sub-region of each grating section of the MSDS-DBR may reflect wavelengths within a spectral sub-band, so that the MSDS-DBR is reflective over a total spectral range that is the union of the spectral sub-bands. When a bias is applied to a first sub-region of the MSDS-DBR (configured to reflect, when unbiased, a first spectral sub-band), the index of refraction of the sub-region may shift, and the range of wavelengths over which the sub-region is reflective may shift accordingly, to overlap a second (e.g., adjacent) spectral sub-band. This may result in a decrease in reflectivity (i.e., an increase in transmissivity), in the first spectral sub-band, and an increase in reflectivity in the second spectral sub-band. For example, the MSDS-DBR may have a total spectral range of 1527.6-1572.4 nm, composed of 7 spectral regions each 6.4 nm wide, each of which is in turn composed of 8 spectral sub-bands, each 0.8 nm wide.

As used herein, that a device is "biased" (or has a bias "applied to its (positive and negative) electrical contacts") means it has a bias current driven through it (for a current-mode device) or it has a reverse bias voltage applied across it (for a voltage-mode device). As used herein, that a device is "unbiased" means it has no bias current driven through it (for a current-mode device) or it has a voltage of zero volts applied across it (for a voltage-mode device). As used herein, "applying a bias" to an electrode means connecting the electrode to a voltage source (or to ground) or to a current source.

The TDS-DBR may have a similar total spectral range, and may operate in a similar manner. It may be composed of P sections that may not be further divided into sub-regions, as a result of which the reflectivity and transmissivity of the TDS-DBR may be controlled over relatively coarse spectral regions that may be wider than the spectral sub-bands of the MSDS-DBR. For example, the TDS-DBR may have 7 spectral regions, each 6.4 nm wide, and each overlapping a corresponding spectral region of the MSDS-DBR.

The MSDS-DBR 606 includes a common electrode structure made up of a plurality M of common positive electrodes 606-1, 606-2, . . . 606-7 and a single common negative electrode.

Each of the M common positive electrodes connects to an electrical contact on each of the DS-DBRs to simultaneously provide an electrical bias to a respective one of the M grating sub-regions of each of the DS-DBRs. For example, it can be seen from FIG. 1A that a first common electrode 606-1 connects to the first grating sub-region in the $1^{st}$ DS-DBR, the $1^{st}$ grating sub-region in the second DS-DBR, and the pattern continues up until the $P^{th}$ DS-DBR. As used herein, a "common electrode" refers to (i) a single electrode in contact with a plurality of semiconductor devices or (ii) a plurality of electrodes connected together by an electrode structure.

In this way, when a bias is applied to a given one of the M common electrodes, say the $1^{st}$ common positive electrode 606-1, the common electrode will simultaneously apply a bias to the first grating sub-region in each DS-DBR of the MSDS-DBR, thereby selecting a corresponding spectral sub-band within each of the plurality P of DS-DBRs.

Figure 2:
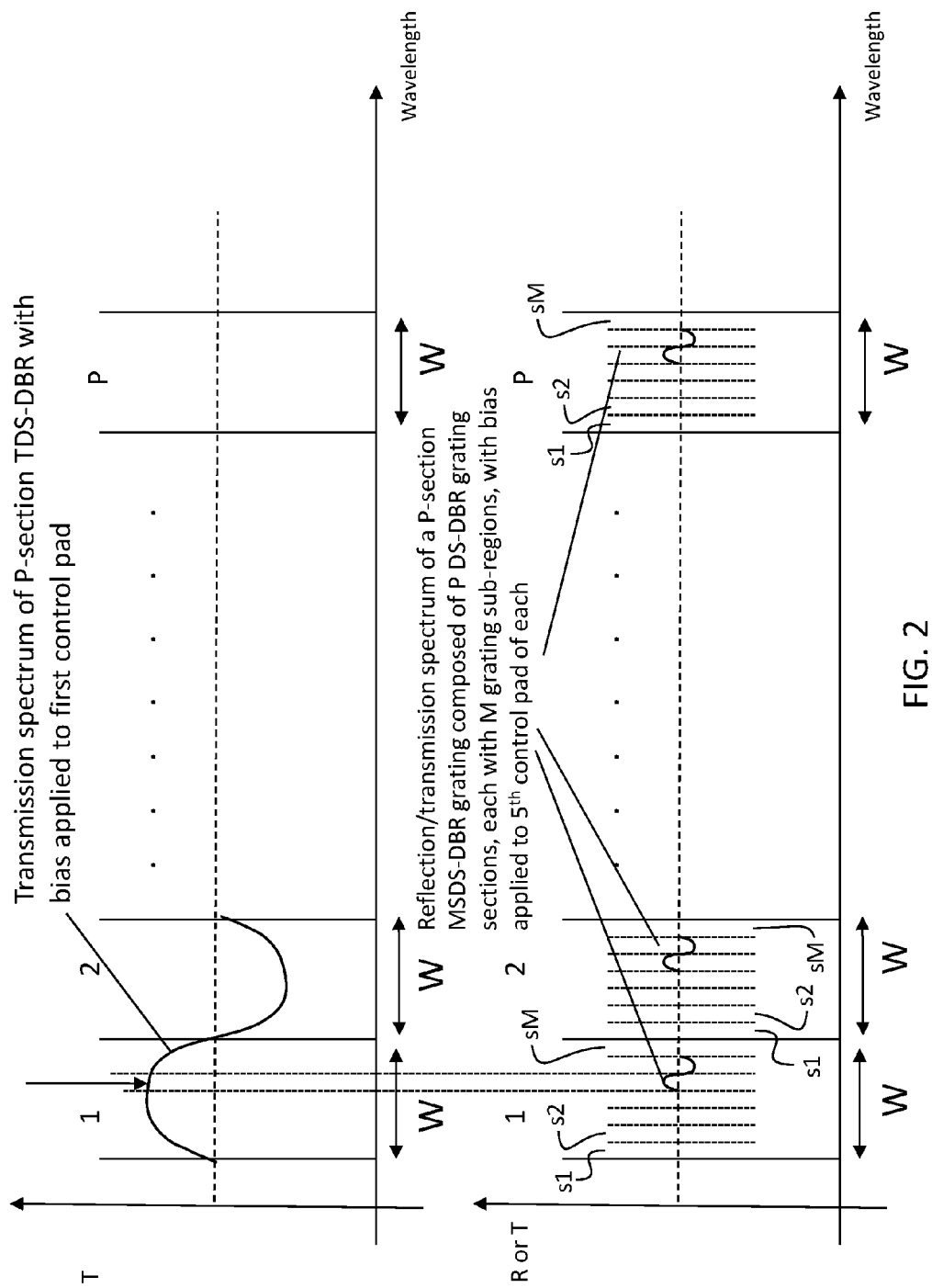
FIG. 2 shows a schematic diagram explaining mode selection of the discrete wavelength tunable lasers of FIG. 1A or FIG. 1B.

This may result in a comb of P selected spectral sub-bands in the DS-DBRs as shown in the lower portion of FIG. 2, each selected spectral sub-band being one of M spectral sub-bands s1, s2, . . . sM of a corresponding DS-DBR.

The spectral profiles of the TDS-DBR 605 and MSDS-DBR 606 are chosen such that the period of the comb produced by the MSDS-DBR is equal to the spectral width of each of the P regions of the TDS-DBR. The lasing mode of the discrete wavelength tunable laser is chosen by the overlap of the selected spectral passband of the transmissive DS-DBR with one of the spectral bands in the selected comb in the MSDS-DBR.

In this way, as shown in FIG. 2, by applying a selecting bias on one of the control electrodes 605-1, 605-2 . . . 605-P of the first TDS-DBR and a selecting bias on one of the common control electrodes of the MSDS-DBR one of M×P modes in the gain spectrum of the RSOA is digitally selected. It may therefore be sufficient to control two out of M+P control electrodes, as opposed to one out of M×P electrodes, thereby simplifying the number of digital controls and reducing the number of connections to a digital driving circuit, simplifying the digital driving circuit compared to that required for a digital scheme using only conventional SG-DBRs and/or DS-DBRs.

Furthermore, by using a TDS-DBR for coarse selection rather than a passive optical component such as an arrayed waveguide grating (AWG), the overall size of the laser cavity can be significantly reduced. The lengths of the TDS-DBR and MSDS-DBR gratings combined can be less than that of an AWG.

In the embodiment of FIG. 2, a transmission spectrum is shown corresponding to a specific one of the P sections of the TDS-DBR when a bias is applied to a first electrode. The reflectance (or transmittance) spectrum of the MSDS-DBR is shown underneath the transmission spectrum of the TDS-DBR. As can be seen, an electrical bias applied to the 5th common electrode results in a transmission or reflection spectrum repeated P times. The alignment of the transmission spectrum of the TDS and that of the MSDS-DBR results in lasing of the 5th mode (out of M×P modes).

In the embodiment shown in FIG. 1A, the DS-DBRs which make up the MSDS-DBR are all transmissive DS-DBRs meaning that when a bias is applied to a grating sub-region to "select" the grating sub-region, it results in transmission of a particular spectral sub-band through the DS-DBR. The laser therefore may have a broadband output mirror 610, such as a broadband mirror grating to complete the laser cavity. For a transmissive MSDS-DBR the cavity length set by broadband mirror grating 610 is set such that there are N or more possible cavity modes within the total spectral region of the laser, such that at least one of the N or more cavity modes overlaps with each of the spectral sub-bands M of each of the P coarse spectral regions. The broadband mirror has a higher reflectivity than the transmissive MSDS-DBR in all regions of the spectrum.

Precise alignment of the cavity modes to the optimum position in the spectral sub-bands can be achieved by an additional separate phase tuning section (603), or by additional fine tuning of the bias on the electrodes of the DS-DBR.

The wavelengths of standing wave modes due to the broadband mirror (BBM) may be taken into account in designing the MSDS-DBR structure.

BBM reflectivity may be adjusted to produce the desired laser slope efficiency and output power and stability, and can be low, e.g., on the order of 5-10%, to have smaller FP (Fabry-Perot) peaks and get higher optical output power, or can be as high as 50-70% to have increased stability but lower output slope efficiency and power. The SOA may be designed to have sufficiently low gain at wavelengths outside of the total spectral range of the TDS-DBR and of the MSDS-DBR that the round-trip gain is less than one for such wavelengths. The total spectral range of the TDS-DBR may also be selected to be greater than the total spectral range of the MSDS-DBR, so that it includes, on one or both ends, grating regions (that may be passive, i.e., not configured to be electrically controlled) that do not correspond to spectral regions of the MSDS-DBR, and that may prevent lasing at wavelengths not within the total spectral range of the MSDS-DBR.

The laser may then lase in a mode within the transmission window of the combined TDS-DBR selected passband and the MSDS-DBR selected sub-band. Lasing at wavelengths outside of this transmission window may be avoided by selecting the characteristics and positions of the TDS-DBR grating, the MSDS-DBR grating, and the BBM so that at such wavelengths the magnitude of the electric field reflected back from the compound mirror formed by the TDS-DBR grating, the MSDS-DBR grating, and the BBM is less than the magnitude of the field reflected back within the transmission window. For example, for such wavelengths reflections from the TDS-DBR grating, the MSDS-DBR grating, and the BBM may not be in phase and may partially cancel.

Grating lengths (the grating length is the length from the front of first notch to the end of the last notch) of all gratings (MSDS-DBR, TDS-DBR, and broad band reflector) play an important role. Total grating lengths may be as short as possible, e.g., <500 µm total, but lengths may be in range of <100 µm up to 2 mm.

Gratings may be etched into the top, side walls, and/or slab of the SOI waveguide.

The gratings of the MSDS-DBR 606 are fabricated in a single waveguide and the electrodes are interdigitated along the waveguide as appropriate to give the required number of DS-DBR gratings in as short a length of waveguide as possible.

In FIG. 1A only three DS-DBR gratings are shown but one skilled in the art will appreciate that a plurality of DS-DBR gratings may be fabricated in the waveguide to produce a wavelength selectable front reflector for the laser cavity. For example, 49 reflective sub-bands would be possible with 7 DBR gratings having 7 states each. The DS-DBR 605 gives transmission wavelength selection as shown in FIG. 2.

As shown in FIG. 1A, the M sub-regions have alternating polarities, such that each sub-region has the opposite polarity to the two regions on either side of it. It is, however envisaged that in an alternative embodiment (not shown) all of the sub-regions may have the same polarity. If all of the sub-regions have the same polarity, all of the positive electrodes would be on one side of the grating and all commonly-connected negative electrodes would be together on the opposite side of the grating.

Each DS-DBR consists of chirped grating sub-regions with grating pitch increasing with grating length.

Each DS-DBR grating section may be formed of contiguous sub-regions. Each sub-region may include a p and n doped region and an associated positive and negative electrode electrically connected to (e.g., by being formed directly on) the p and n doped regions to form a diode. The doping and electrode structures may be similar, for example, to those illustrated for the phase tuning region 88 of FIGS. 5(c)-5(e) of the '673 patent (or the p-doped and n-doped regions may extend into the respective side walls of (or to the center of) the waveguide). Electrical isolation between each diode and neighboring diodes is achieved by physical separation of adjacent electrodes along the grating propagation direction. The separation (i.e. the gap between adjacent electrodes) may be great enough that a bias applied across one diode via its electrodes to change its reflectance or transmittance will not give rise to a bias being generated at the neighboring diode. As well as physical separation of adjacent electrodes, the p and n doped regions of adjacent diodes (which are conductive, but less conductive than metal) may also be physically separate from one another to provide further electrical isolation between any given diode and its neighbors along the grating propagation direction. The physical separation of doped regions may be of greater consequence (in avoiding cross-talk) if grating sub-regions are to be driven concurrently. If, in operation, only one contact in one particular grating section is driven (which is the case in some embodiments) then crosstalk may be of lower concern, and patterning the contacts without patterning the doped regions may have a similar effect to that of patterning both the contacts and the doped regions.

Each DS-DBR will have slightly different grating periods, corresponding to the different spectral sub-bands to which each grating sub-region corresponds. DS-DBRs covering a longer-wavelength spectral region may be constructed with longer-period gratings.

The spacing between adjacent DS-DBRs may be small or almost zero, to minimize gaps in between any two DS-DBRs. The gaps may be made to be just sufficiently large for electrical isolation.

When current is injected into one electrode, it will not spread into the adjacent regions. Electrodes are separated by contact isolation. In some embodiments there is no p+ doping/metallization in the isolation gaps.

Figure 1B:
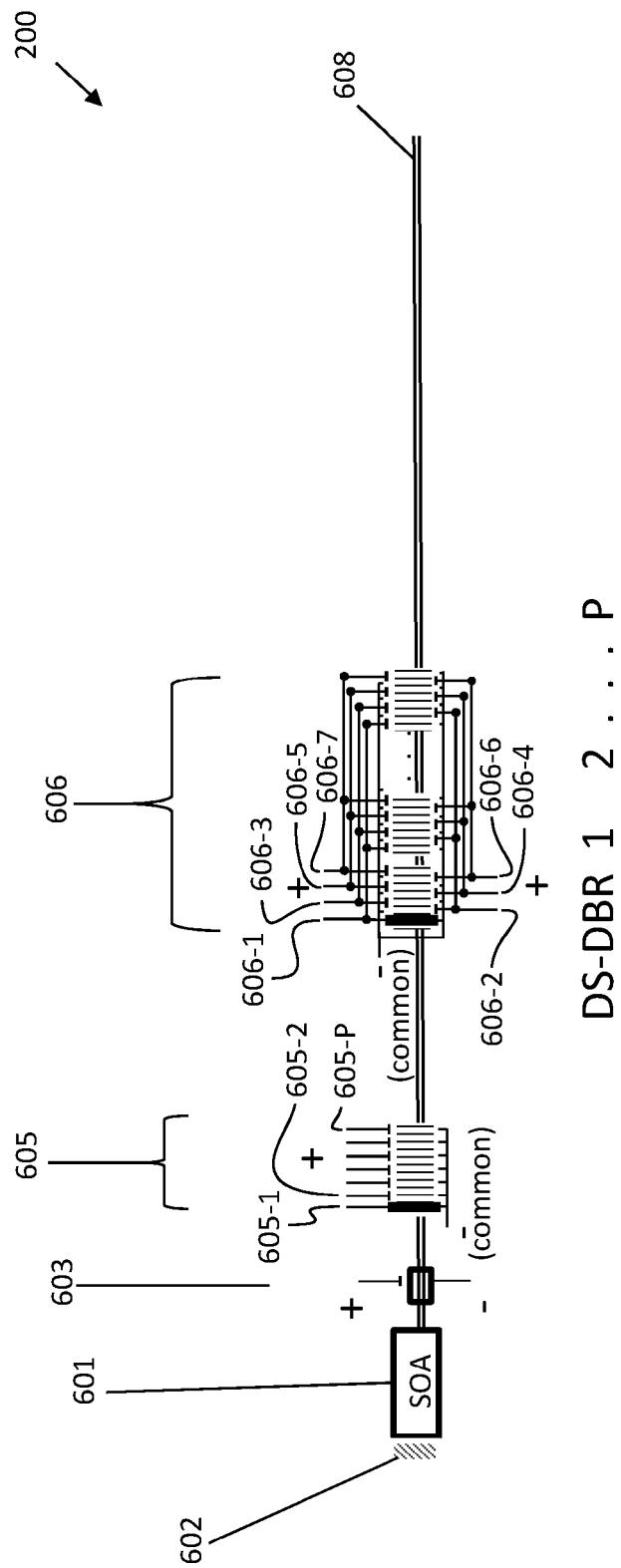
FIG. 1B shows a schematic diagram of an alternative discrete wavelength tunable laser including a reflective MSDS-DBR.

An alternative discrete wavelength tunable laser 200 is shown in FIG. 1B. The laser of FIG. 1B differs from that of FIG. 1A in that it includes a reflective MSDS-DBR instead of a transmissive MSDS-DBR. A further broadband mirror may be absent from the laser, since the reflective MSDS-DBR itself forms the output mirror of the laser cavity. The cavity length may be shorter in the reflective MSDS-DBR structure. Again, the TDS-DBR 605 gives transmission wavelength selection as shown in FIG. 2. The TDS-DBR may be designed so that its maximum reflectivity when biased is less than the maximum reflectivity of the MSDS-DBR, so that the round-trip gain for light reflecting from the TDS-DBR is less than one.

The embodiments shown in FIG. 1A and FIG. 1B may have a relatively small physical size as they may include only DS-DBR gratings, and no DAC may be used for switching. In some embodiments a slow DAC is included for control of a phase section 603, to trim the overall wavelength in response to drift with age or environment.

Figure 3:
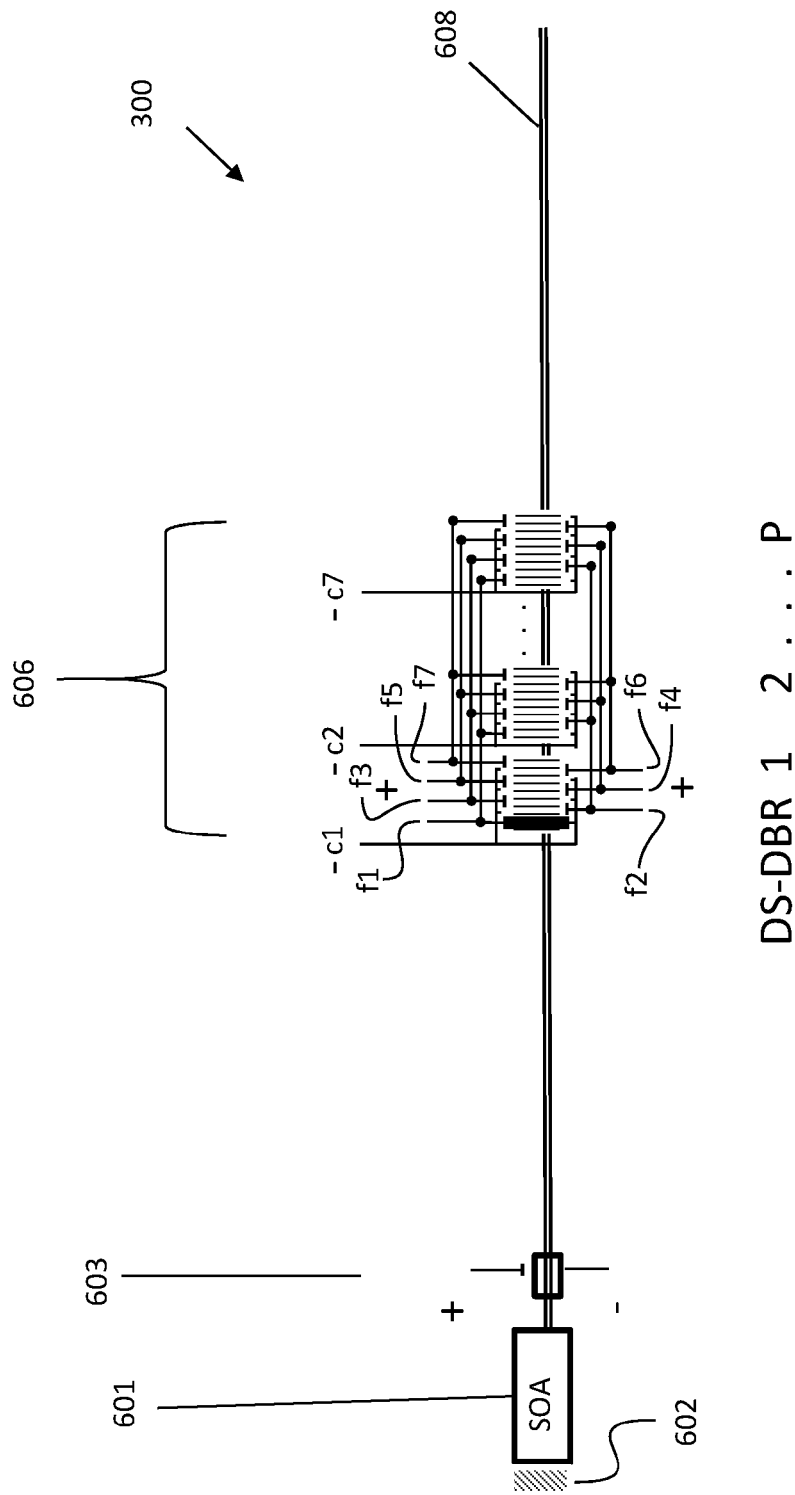
FIG. 3 shows a schematic diagram of an alternative discrete wavelength tunable laser.

Another embodiment of a discrete wavelength tunable laser 300 is shown in FIG. 3. The laser of FIG. 3 differs from that in FIG. 1B in that the TDS-DBR is removed and the coarse selection function that had been performed by the TDS-DBR in FIGS. 1A and 1B is integrated into the MSDS-DBR by making the negative electrodes separate and selectable. There is a common negative electrode for each of the plurality P of DS-DBRs.

In this case a channel is selected for lasing by applying a positive voltage to a selected one of the common control electrodes f1, f2, . . . fM (where, in FIG. 3, M=7), the selected control electrode being associated with the sub-band corresponding to the channel to be selected, as in earlier embodiments; then a large enough negative voltage is applied to only one of the negative electrodes so as to turn on the diodes only in the DS-DBR that corresponds to the coarse region of the spectrum containing the channel being selected.

The negative voltage applied to the other P−1 negative electrodes may be such that the voltage drop across the diodes of the same sub-band on the other DS-DBR gratings resulting from the application of the positive voltage to the common control electrode are below their turn-on voltage.

Some embodiments differ from that of FIG. 3 in that the MSDS-DBR takes the form of a reflective MSDS-DBR with coarse negative electrodes.

Figure 4:
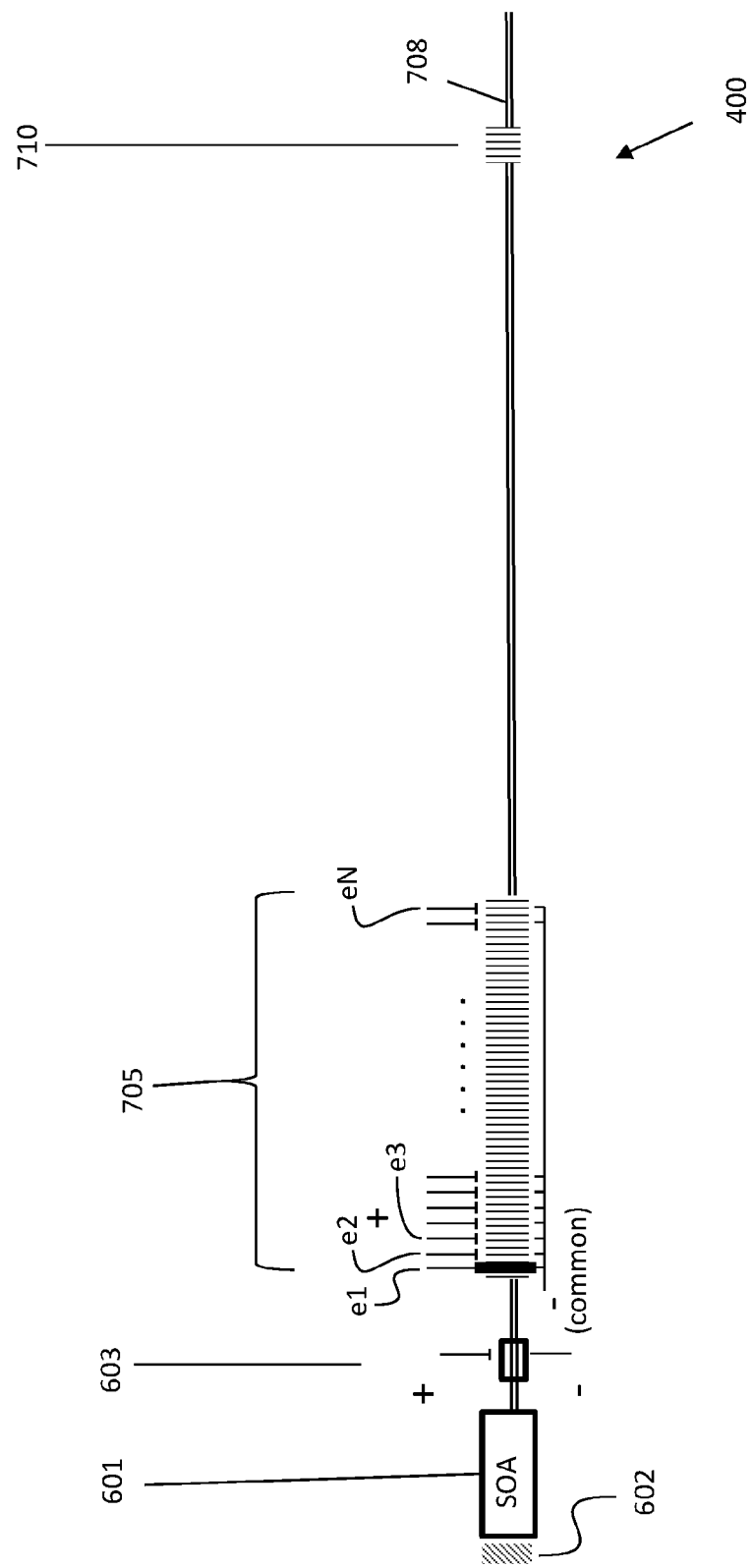
FIG. 4 shows a schematic diagram of a further alternative discrete wavelength tunable laser.

FIG. 4 shows a tunable laser 400. In some embodiments the laser 400 includes a reflective semiconductor optical amplifier (RSOA) (including a semiconductor optical amplifier element 601, and a highly reflective broadband mirror 602), a phase tuner 603, a single N-section DS-DBR grating 705 with N corresponding positive electrodes e1, e2 . . . eN, and a broadband output mirror 710. The phase tuner 603, the N-section DS-DBR grating 705, the broadband output mirror 710 and the waveguides joining these elements may be fabricated on (and be part of) a silicon photonics chip, which may also include electronic components (e.g., transistors used to drive the electrodes). The RSOA may be a separate chip (e.g., a III-V semiconductor laser chip) separately fabricated, aligned with the silicon photonics chip (e.g., using passive alignment relying on registration features on the RSOA and on the silicon photonics chip, using active alignment, or using a combination of passive alignment (in some degrees of freedom) and active alignment (in the remaining degrees of freedom)), and bonded (e.g., flip-chip bonded) to the silicon photonics chip). As mentioned above, the RSOA may include a semiconductor optical amplifier element 601 and a highly reflective broadband mirror 602 on the back facet of the semiconductor optical amplifier element. The highly reflective broadband mirror may be a highly reflective multilayer dielectric coating, or a metal coating. As used herein, a "highly reflective broadband mirror" that is part of an RSOA has a (power) reflectance of at least 90% over its bandwidth, and its bandwidth is at least equal to the 3 dB bandwidth of the gain curve of the semiconductor optical amplifier element.

The N-section DS-DBR grating 705 may operate in a manner analogous to that of the MSDS-DBR. The DS-DBR grating may be a chirped Bragg reflector. When the DS-DBR is unbiased, each grating section of the DS-DBR may reflect wavelengths within a respective spectral region, so that the DS-DBR grating 705 is reflective over a total spectral range that is the union of the spectral regions. When a first section of the N-section DS-DBR grating 705, which when unbiased is reflective in a first spectral region, is biased (i.e., has a non-zero bias voltage applied across it, or a bias current driven through it), the index of refraction of the first section may shift, and the range of wavelengths over which the section is reflective may shift accordingly, to overlap the (e.g., adjacent) spectral region of a second section (which remains unbiased), to form a reflectance peak (i.e., a wavelength range over which the N-section DS-DBR grating 705 has increased reflectance) in the second spectral region, and a reflectance dip (i.e., a wavelength range over which the N-section DS-DBR grating 705 has decreased reflectance) in the first spectral region.

In an embodiment (such as that illustrated in FIG. 4) in which the DS-DBR grating 705 is not an MSDS-DBR, each independently controllable portion of the chirped grating of the DS-DBR grating 705 may be referred to either as a "section" or as a "sub-region", and each may correspond to a "spectral region", the spectral regions together forming the "spectral range" or "total spectral range" of the DS-DBR. One of the sections of the DS-DBR grating 705 (e.g., at one end of the DS-DBR grating 705) may have a spectral region at one end of the total spectral range of the DS-DBR grating 705, and it may be the case that, if the section were biased, its spectral region would shift to be outside (e.g., just outside) of the total spectral range of the DS-DBR grating 705. Accordingly, this section may be unused during normal operation, and may not be fitted with electrical contacts.

The N-section DS-DBR grating 705 may form, together with the broadband output mirror 710, a compound mirror having a reflectance that depends on the respective reflectances of the N-section DS-DBR grating 705 and of the broadband output mirror 710, and on the relative phase of the light reflected from these two elements (i.e., on their positions relative to each other along the waveguide). For example, if the reflection from the N-section DS-DBR grating 705 is out of phase with the reflection from the broadband output mirror 710 (i.e., the light reflected from these two elements interferes destructively), then the reflectance of the compound output mirror may be greatest at the wavelength of the reflectance dip of the N-section DS-DBR grating 705, and the laser 400 may lase at this wavelength. If instead the reflection from the N-section DS-DBR grating 705 is in phase with the reflection from the broadband output mirror 710 then the reflectance of the compound output mirror may be greatest at the wavelength of the reflectance peak of the N-section DS-DBR grating 705, and the laser 400 may lase at this wavelength.

In some embodiments the reflectance of the DS-DBR at the reflectance peak is sufficiently great that the broadband output mirror 710 is not required for lasing, and in such an embodiment the broadband output mirror 710 may be absent or present. If the broadband output mirror 710 is present, it may be positioned so that the reflection from the N-section DS-DBR grating 705 is in phase with the reflection from the broadband output mirror 710.

As used herein, a transmissive DS-DBR (i.e., a TDS-DBR) is a DS-DBR within a laser cavity, and used in transmission in the sense that the TDS-DBR is between the gain medium of the laser and a reflective element that defines one end of the laser cavity. The laser may be configured to lase at a wavelength that falls within a reflectance dip of the TDS-DBR, or within a reflectance peak of the TDS-DBR.

The N-section DS-DBR grating 705 is used to create N discrete wavelength states for the tunable laser 400. In one embodiment, N=49; in other embodiments N may be larger or smaller than 49. The term "reflectivity" is used herein to mean "reflectance" and the term "transmissivity" is used herein to mean "transmittance".

In this embodiment, one control circuit controlling all of the control electrodes may be used. The grating design is simple, and the control circuit is simpler, and the laser cavity length can be made short. However the number of control electrodes may be larger, e.g., M×P as compared to M+P for the embodiments of FIGS. 1A, 1B and 3 (where M×P=N is the number of available wavelengths). A greater number of electrodes may be more difficult for a control circuit to connect to and manage, especially as the number N of laser modes needed scales to numbers much higher than the embodiment shown which includes 49 grating sub-regions.

Figure 5A:
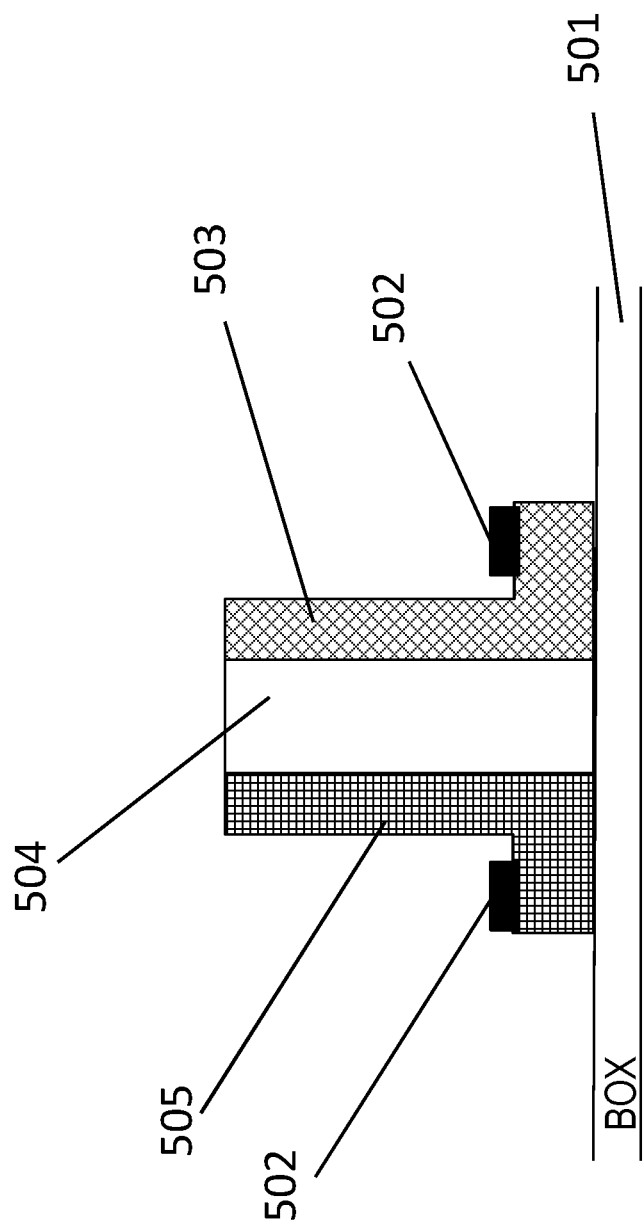
FIG. 5A shows a cross-section of a DS-DBR section, according to one embodiment.

FIG. 5A shows a transverse cross section of a DS-DBR section, i.e., a cross section taken along a plane perpendicular to the direction of propagation of light in the waveguide. The waveguide of FIG. 5A is a rib waveguide including a slab of a first height and a first width formed on a buried oxide layer 501 on a silicon wafer, and a rib, of a second height and a second width less than the first width, formed on the slab. Metal contacts 502 formed on the slab and adjacent to the rib provide respective conductive paths to a p-doped silicon region 503 and an n-doped silicon region 505. An intrinsic region 504 is present between the p-doped silicon region 503 and the n-doped silicon region 505. The structure of FIG. 5A forms a horizontal p-i-n diode junction, that may be fabricated by implanting dopants into the side walls of the waveguide, as mentioned above. The p-i-n diode junction may act as a phase tuning region for the DS-DBR section, in which the carrier density, and, accordingly, the refractive index are manipulated by application of a forward or reverse bias.

Figure 5B:
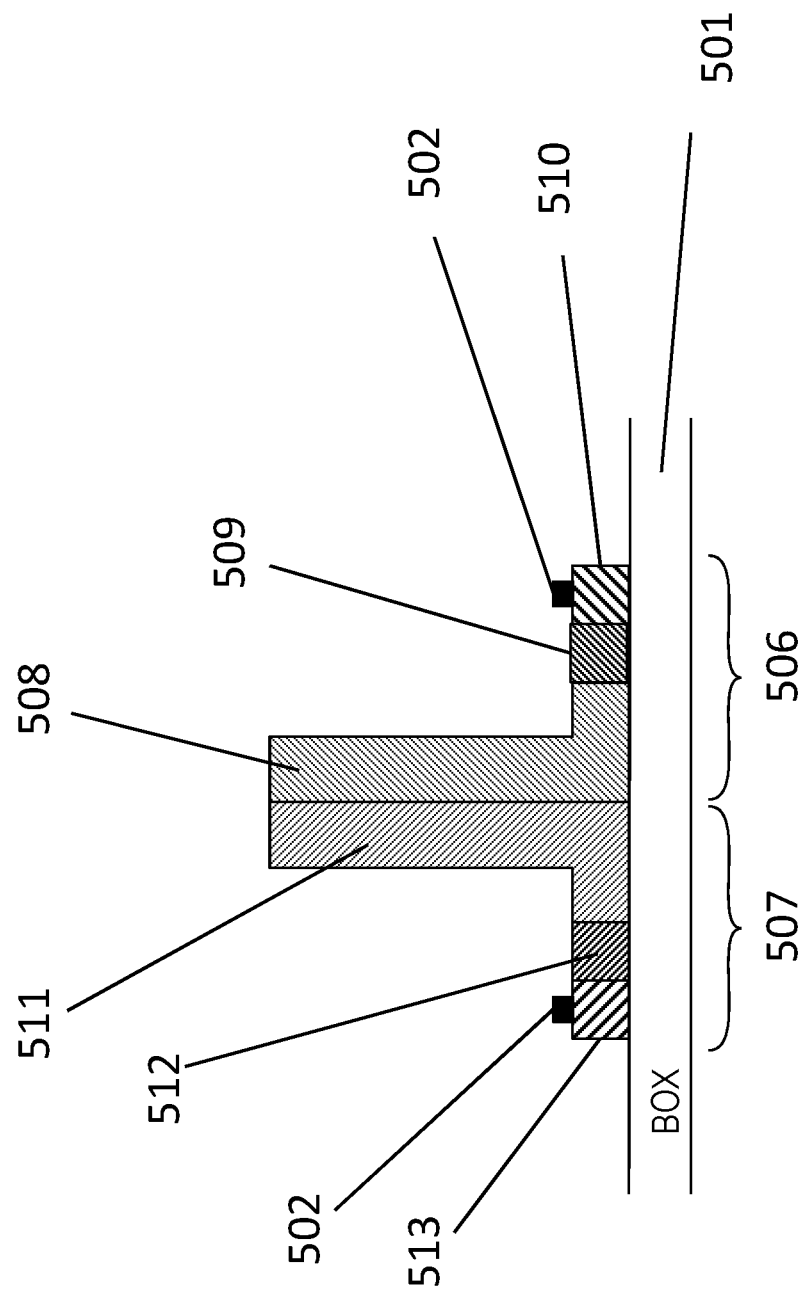
FIG. 5B shows a cross-section of a DS-DBR section, according to one embodiment.

FIG. 5B shows a transverse cross section of a phase tuning region of a DS-DBR section according to another embodiment. The phase tuning region of FIG. 5B is made up of a bulk semiconductor electro-optical material which has been doped to form a horizontal semiconductor junction in the form of a p-n junction. The p-n junction is made up of a p-type region 506, and an n-type region 507. The p-type region 506 is graded, e.g., within the slab, into three layers of varying different doping strengths: a p-doped layer 508, a p+-doped layer 509, and a p++-doped layer 510. The n-doped region 507 is also graded into three layers of varying doping strengths: an n-doped layer 511, an n+-doped layer 512, and an n++-doped layer 513. The layers are arranged so that the p and n layers 508, 511 overlap the waveguide and so that the p++ and n++ layers 510, 513 are furthest away from the waveguide. Electrodes are located directly on the respective outward-most doped regions 510, 513. In particular, the electrodes are located directly on the p++ and n++ layers 510, 513 of the doped regions 506, 507. Like the p-i-n junction of FIG. 5A, the p-n diode junction of FIG. 5B may act as a phase tuning region for the DS-DBR section, in which the carrier density, and, accordingly, the refractive index are manipulated by application of a forward or reverse bias. The use of doped regions graded into three layers of varying different doping strengths may result in improved diode efficiency (e.g., lower power consumption, less self-heating), and the diode may have higher speed for the same insertion loss.

Figure 5C:
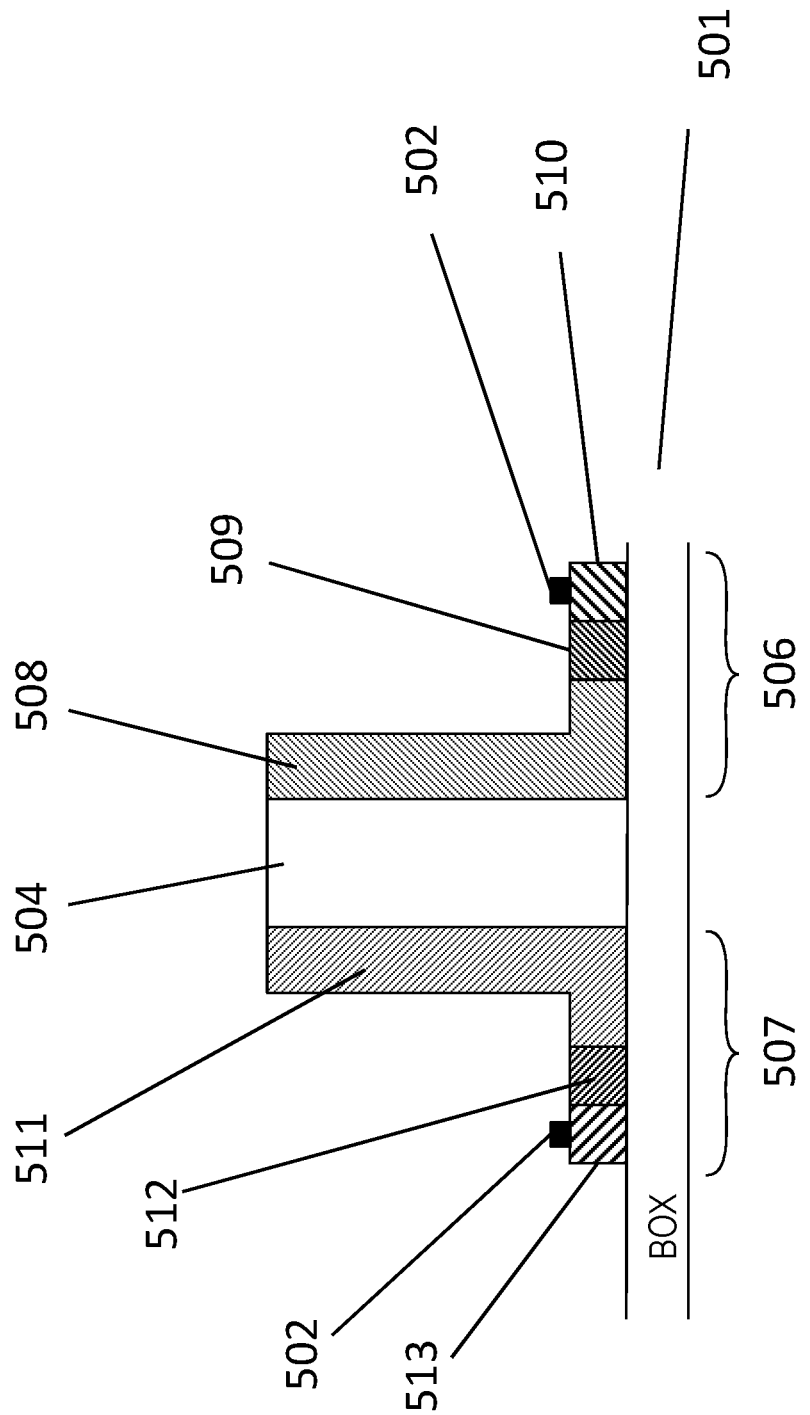
FIG. 5C shows a cross-section of a DS-DBR section, according to one embodiment.

Referring to FIG. 5C, in one embodiment, a p-i-n diode junction may also (like the structure of FIG. 5B) include a p-type region 506, and an n-type region 507, the p-type region 506 being graded into three layers of varying different doping strengths: a p-doped layer 508, a p+-doped layer 509, and a p++-doped layer 510, and the n-doped region 507 also being graded into three layers of varying doping strengths: an n-doped layer 511, an n+-doped layer 512, and an n++-doped layer 513. An intrinsic region 504 may be present between the p-type region 506, and the n-type region 507.

Figure 5D:
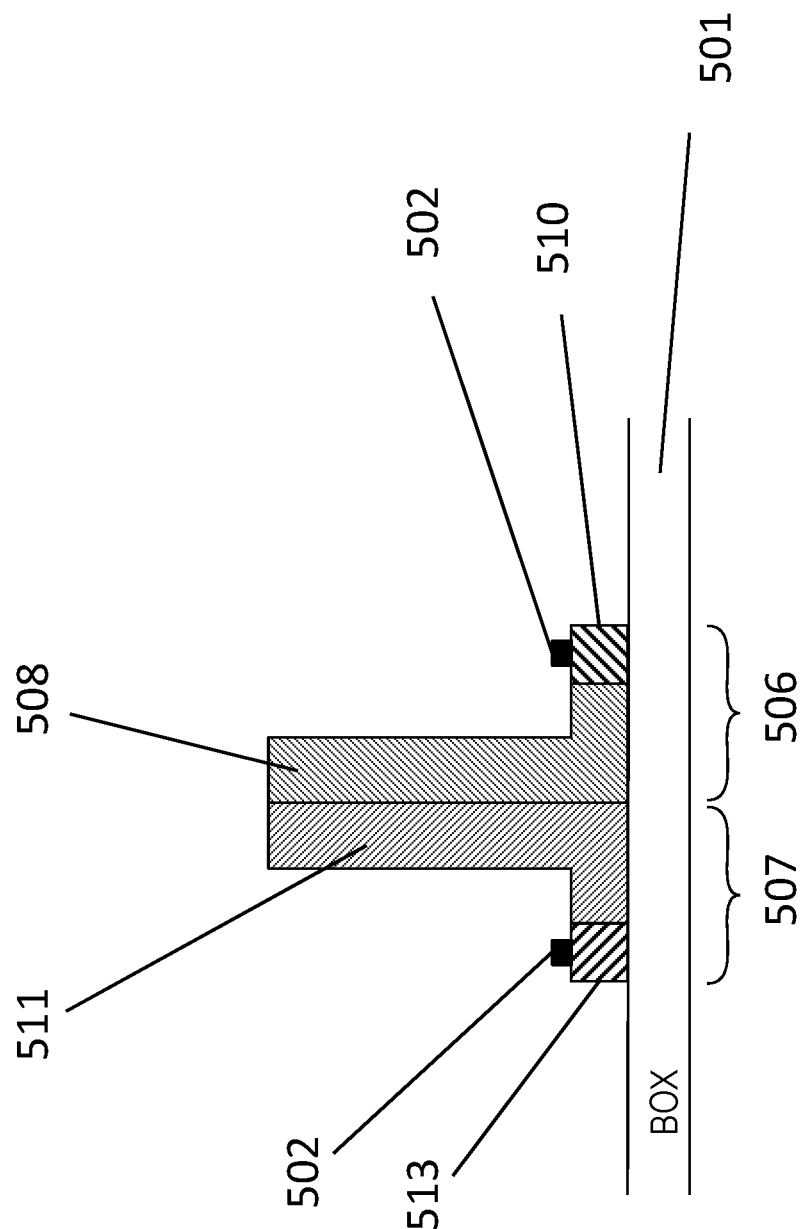
FIG. 5D shows a cross-section of a DS-DBR section, according to one embodiment.

A p-n junction like that of FIG. 5B, may, in some embodiments, be fabricated with the p-type region and n-type region each having only two layers of varying different doping strengths, or with the p-type region and n-type region each having only a single layer, i.e., each having a substantially uniform respective doping strength. Referring to FIG. 5D, in one embodiment, for example, a p-n junction may be fabricated with the p-type region 506 having a p-doped layer 508 and a p++-doped layer 510, and with the n-doped region 507 having an n-doped layer 511, and an n++-doped layer 513.

Although exemplary embodiments of a discrete wavelength tunable laser have been specifically described and illustrated herein, many modifications and variations will be apparent to those skilled in the art. Accordingly, it is to be understood that a discrete wavelength tunable laser constructed according to principles of this invention may be embodied other than as specifically described herein. The invention is also defined in the following claims, and equivalents thereof.

What is claimed is:

1. A discrete wavelength tunable laser comprising:
a reflective semiconductor optical amplifier having a back facet, an output facet, and a highly reflective broadband mirror on the back facet; and
a DS-DBR grating coupled to the output facet, the DS-DBR grating comprising a plurality of grating sections arranged along a waveguide,
each of the grating sections being configured to pass or reflect light over a given spectral region, the given spectral region being different from the spectral regions of the other DS-DBR grating sections,
each of the grating sections including a positive electrical contact and a negative electrical contact, each of the grating sections being configured to pass or reflect light of its spectral region when an electrical bias is applied to its positive and negative electrical contacts.

2. The tunable laser of claim 1, further comprising a broadband output mirror, the DS-DBR grating being between the reflective semiconductor optical amplifier and the broadband output mirror, wherein the tunable laser is configured to lase at a wavelength in a spectral region of a grating section, of the plurality of grating sections, configured, as a result of an electrical bias applied to its positive and negative electrical contacts, to pass light.

3. The tunable laser of claim 1, wherein the tunable laser is configured to lase at a wavelength in a spectral region of a grating section, of the plurality of grating sections, configured, as a result of an electrical bias applied to its positive and negative electrical contacts, to reflect light.

4. The tunable laser of claim 3, further comprising a broadband output mirror, the DS-DBR grating being between the reflective semiconductor optical amplifier and the broadband output mirror.

5. The tunable laser of claim 1, wherein the DS-DBR grating comprises 30 grating sections.

6. The tunable laser of claim 1, further comprising a phase tuner between the reflective semiconductor optical amplifier and the DS-DBR grating.

7. A discrete wavelength tunable laser comprising:
a reflective semiconductor optical amplifier having a back facet, an output facet, and a highly reflective broadband mirror on the back facet;
a DS-DBR grating coupled to the output facet, the DS-DBR grating having a plurality of grating sections arranged along a waveguide; and
a broadband output mirror, the DS-DBR grating being between the reflective semiconductor optical amplifier and the broadband output mirror,
each of the grating sections being configured to pass or reflect light over a given spectral region, the given spectral region being different from the spectral regions of the other DS-DBR grating sections, each of the grating sections including a positive electrical contact and a negative electrical contact, each of the grating sections being configured to pass or reflect light of its spectral region when an electrical bias is applied to its positive and negative electrical contacts.

8. The tunable laser of claim 7, wherein the tunable laser is configured to lase at a wavelength in a spectral region of a grating section, of the plurality of grating sections, configured, as a result of an electrical bias applied to its positive and negative electrical contacts, to pass light.

9. The tunable laser of claim 7, wherein the tunable laser is configured to lase at a wavelength in a spectral region of a grating section, of the plurality of grating sections, configured, as a result of an electrical bias applied to its positive and negative electrical contacts, to reflect light.

10. The tunable laser of claim 7, wherein each of the grating sections includes a p-i-n diode junction, the positive and negative electrical contacts located at p and n doped regions of the p-i-n junction respectively for providing an electrical bias to the p-i-n junction for control of the transmittance or reflectance of each of the spectral regions.

11. The tunable laser of claim 10, wherein the p-i-n diode junctions are horizontal p-i-n junctions.

12. The tunable laser of claim 11, wherein the waveguide has a first side wall and a second side wall opposite the first side wall, and wherein a p-i-n diode junction of the plurality of p-i-n diode junctions includes:
an n-type region at the first side wall, including n-type dopant atoms implanted into the first side wall, and
a p-type region at the second side wall, including p-type dopant atoms implanted into the second side wall.

13. The tunable laser of claim 12, wherein:
the waveguide includes a rib formed on a slab, the rib comprising the first side wall and the second side wall;
the n-type region extends into the slab and includes an n++-doped layer in the slab;
the p-type region extends into the slab and includes a p++-doped layer in the slab;
the negative electrical contact is on the n++-doped layer; and
the positive electrical contact is on the p++-doped layer.

14. The tunable laser of claim 7, wherein each of the grating sections includes a p-n diode junction, the positive and negative electrical contacts located at p and n doped regions of the p-n junction respectively for providing an electrical bias to the p-n junction for control of the transmittance or reflectance of each of the spectral regions.

15. The tunable laser of claim 14, wherein the p-n diode junctions are horizontal p-n junctions.

16. The tunable laser of claim 15, wherein the waveguide has a first side wall and a second side wall opposite the first side wall, and wherein a p-n diode junction of the plurality of p-n diode junctions includes:
an n-type region at the first side wall, including n-type dopant atoms implanted into the first side wall, and
a p-type region at the second side wall, including p-type dopant atoms implanted into the second side wall.

17. The tunable laser of claim 16, wherein:
the waveguide includes a rib formed on a slab, the rib comprising the first side wall and the second side wall;
the n-type region extends into the slab and includes an n++-doped layer in the slab;
the p-type region extends into the slab and includes a p++-doped layer in the slab;
the negative electrical contact is on the n++-doped layer; and
the positive electrical contact is on the p++-doped layer.

18. The tunable laser of claim 7, wherein a first grating section of the grating sections is electrically isolated from a second grating section of the grating sections, the second grating section being adjacent, along the waveguide, to the first grating section.

19. The tunable laser of claim 7, wherein the DS-DBR grating is part of a silicon photonics chip.

20. The tunable laser of claim 7, wherein the DS-DBR grating comprises 30 grating sections.

* * * * *